United States Patent
Colombo et al.

(10) Patent No.: US 11,063,120 B2
(45) Date of Patent: Jul. 13, 2021

(54) METAL-GRAPHENE STRUCTURES FORMING A LATTICE OF INTERCONNECTED SEGMENTS

(71) Applicant: TEXAS INSTRUMENTS INCORPORATED, Dallas, TX (US)

(72) Inventors: Luigi Colombo, Dallas, TX (US); Archana Venugopal, Dallas, TX (US); Benjamin Stassen Cook, Addison, TX (US); Nazila Dadvand, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/232,123

(22) Filed: Dec. 26, 2018

(65) Prior Publication Data

US 2019/0207002 A1    Jul. 4, 2019

Related U.S. Application Data (60) Provisional application No. 62/612,159, filed on Dec. 27, 2017.

(51) Int. Cl.
*H01L 29/16* (2006.01)
*H01L 21/768* (2006.01)
(Continued)

(52) U.S. Cl.
CPC ............ *H01L 29/1606* (2013.01); *B05D 1/00* (2013.01); *C01B 32/184* (2017.08); *C01B 32/194* (2017.08); *C23C 16/0281* (2013.01); *C23C 16/26* (2013.01); *C25D 11/00* (2013.01); *H01L 21/0257* (2013.01); *H01L 21/76805* (2013.01);
(Continued)

(58) Field of Classification Search
CPC ............ H01L 29/1606; H01L 29/0673; H01L 27/0688; H01L 24/00; H01L 23/53276; H01L 21/76879; H01L 21/76865; H01L 21/76805; H01L 21/0257; C01B 32/194; C01B 32/184
See application file for complete search history.

(56) References Cited

U.S. PATENT DOCUMENTS

2013/0266738 A1    10/2013   Lin et al.
2019/0202174 A1*   7/2019    Colombo ................ B32B 9/041

FOREIGN PATENT DOCUMENTS

KR     20130138568 A    12/2013
KR       101358143 B1    2/2014
RU       2013157047 A    6/2015

OTHER PUBLICATIONS

International Search Report for PCT/US2018/068168 dated Apr. 25, 2019.
(Continued)

*Primary Examiner* — Laura M Menz
*Assistant Examiner* — Candice Chan
(74) *Attorney, Agent, or Firm* — Ray A. King; Charles A. Brill; Frank D. Cimino (57) ABSTRACT

A structure includes a metal layer and a plurality of interconnected unit cells forming a lattice contained at least partly within the metal layer, including at least a first unit cell formed of first interconnected graphene tubes, and a second unit cell formed of second interconnected graphene tubes, wherein the metal layer protrudes through holes within the lattice.

13 Claims, 7 Drawing Sheets

(51) Int. Cl.
    *C01B 32/194*     (2017.01)
    *H01L 23/532*     (2006.01)
    *H01L 27/06*     (2006.01)
    *H01L 29/06*     (2006.01)
    *C23C 16/26*     (2006.01)
    *H01L 21/02*     (2006.01)
    *C01B 32/184*     (2017.01)
    *C25D 11/00*     (2006.01)
    *C23C 16/02*     (2006.01)
    *B05D 1/00*     (2006.01)
    *H01L 23/00*     (2006.01)

(52) U.S. Cl.
    CPC .. *H01L 21/76865* (2013.01); *H01L 21/76879* (2013.01); *H01L 23/53276* (2013.01); *H01L 24/00* (2013.01); *H01L 27/0688* (2013.01); *H01L 29/0673* (2013.01)

(56) References Cited

OTHER PUBLICATIONS

Xiaoyu Zheng et. al., Ultralight, Ultrastiff Mechanical Metamaterials; Science 344 (2014) 1373-1377.
T. A. Schaedler, et al., Ultralight Metallic Microlattices; Science 334 (2011) 962-965.

\* cited by examiner

METAL-GRAPHENE STRUCTURES FORMING A LATTICE OF INTERCONNECTED SEGMENTS

CROSS-REFERENCE TO RELATED APPLICATION(S)

This application claims priority to U.S. Provisional Application No. 62/612,159, filed Dec. 29, 2017, which is hereby incorporated by reference.

BACKGROUND

Metals, metal alloys, and metal matrix composites (MMCs) are the most widely used structural materials in various industries. Regardless of the type of metal/matrix material, one of the main reasons for an increase in the amount of research on graphene-reinforced structural composites is the availability of bulk quantities of high-quality graphene. The structure of graphene is critical to its properties and its interaction with matrix material. Graphene is primarily added as a structural reinforcement to metal systems in order to enhance mechanical properties. Therefore, light weight metal systems, such as aluminum and magnesium have been investigated as the matrix with graphene reinforcement to fabricate composites with high specific strength. However, even with the use of graphene, conventional graphene-metal composites are still not sufficient to achieve optimum strength, structural stability, electrical conductivity, and thermal conductivity. Thus, in order to solve these problems, it is desirable to provide a metal-graphene structure that is able to overcome the above disadvantages. Advantages of the present invention will become more fully apparent from the detailed description of the invention hereinbelow.

SUMMARY

In one aspect of the disclosure, a structure includes a metal layer and a plurality of interconnected unit cells including at least a first unit cell formed of first interconnected segments, and a second unit cell formed of second interconnected segments. The plurality of interconnected unit cells forms a lattice. The lattice is contained at least partly within the metal layer.

In another aspect of the disclosure, a bump structure for an integrated circuit package includes a metal layer and a plurality of interconnected unit cells including at least a first unit cell formed of first interconnected segments, and a second unit cell formed of second interconnected segments. The plurality of interconnected unit cells forms a lattice. The lattice is contained at least partly within the metal layer.

In yet another aspect of the disclosure, a method of forming a bump structure for an integrated circuit package includes forming a metal layer, and forming a lattice at least partly within the metal layer, including by photo-initiating polymerization of a monomer in a pattern of interconnected unit cells to form a polymer lattice (wherein the interconnected unit cells include at least a first unit cell formed of first interconnected segments, and a second unit cell formed of second interconnected segments), removing the unpolymerized monomer, coating the polymer lattice with a metal, removing the polymer lattice to leave a metal lattice, depositing graphitic carbon on the metal lattice, converting the graphitic carbon to graphene or carbon nanotubes, and removing the metal lattice.

In yet another aspect of the disclosure, a structure includes a metal layer and a graphene sheet having at least one hole. The graphene sheet is contained at least partly within the metal layer.

In yet another aspect of the disclosure, a method of forming a structure includes forming a metal layer and forming a graphene sheet at least partly within the metal layer. The graphene sheet has at least one hole.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

For purposes of this disclosure, the terms "film", "coating", "sheet", "structure", and "layer" (and derivatives thereof) may be used interchangeably.

For purposes of this disclosure, the phrase "integrated circuit package" may alternatively encompass "semiconductor device" (and derivatives thereof) and thus, may be used interchangeably.

For purposes of this disclosure, the term "lattice" may alternatively encompass "microlattice", "nanolattice", and "superlattice" (and derivatives thereof) and thus, may be used interchangeably. Similarly, the term "structure" may alternatively encompass "microstructure", "nanostructure", and "superstructure" (and derivatives thereof) and thus, may be used interchangeably.

Sheets of 2D Graphene are considered as good reinforcement materials to improve mechanical properties of their composites with metals due to their excellent Young's modulus and mechanical strength. Graphene atoms are accessible from both sides resulting in formation of stronger interaction with their surrounding matrix atoms or molecules.

Aspects of this disclosure include metal matrix composites reinforced with a 3D graphene superlattice, which enables robust interfacial interaction between functionalized graphene and metals such as W, Cu, Al, Ni, Pd, Au, Ag, Co, etc., and combinations thereof, assuring of excellent structural retention of the graphene superlattice structure throughout the composites. As a result, the fabricated composites (i.e., metal-graphene lattice composite structure) can demonstrate high strength, ductility, and/or malleability. Also, the yield strength and the elongation to failure of the fabricated composite can be higher than that of the unreinforced metal (or metal matrix). In addition, this strategy of employed graphene lattice reinforcement may be extended to many reducible metals such as Co and Ni for fabrication of graphene lattice-strengthened metal matrix composites in order to enhance strength, ductility, and/or malleability.

Toughness, which is described as the resistance of material to fracture, is often related and measured as the released energy needed to cause fracture. It is expected to obtain an outstanding toughness modulus (which combines both strength, ductility, and malleability) for the graphene microlattice embedded in the metal matrix. This can be explained by considering the intrinsic toughening in which the metal-graphene lattice composite structure has on the deformation threshold level of matrix grain in resisting crack initiation. The fabricated 3D graphene lattice creates enhanced interaction zones between the reinforcement and the matrix. In addition, the 3D graphene lattice is encapsulated (either partly or entirely) by the metal matrix while grain growth of the metal matrix is restricted by the graphene lattice structure. After embedding the graphene lattice within the metal matrix, the metal grains located at the interaction zones should deform differently from the ones located elsewhere. The larger metal grains located outside of interaction zone should resist cracking otherwise initiated in the rigid interaction zone.

It has been found that an organic/inorganic superstructure may be used as a template for the formation of a 3D metal superstructure that may then be used to grow graphitic carbon on the surface of the metal. The template may be fabricated through a self-propagating photopolymer waveguide technique (see, e.g., Xiaoyu Zheng et. al., Ultralight, Ultrastiff Mechanical Metamaterials; *Science* 344 (2014) 1373-1377 and T. A. Schaedler, et al., Ultralight Metallic Microlattices; *Science* 334 (2011) 962-965) in which an interconnected 3D photopolymer lattice may be produced upon exposure of an appropriate liquid photomonomer to collimated UV light through a specifically designed mask that contains openings with certain spacing and size. The fabricated microlattice may then be coated by electroless copper or other suitable metal (e.g. Ni, Co, Au, Ag, Cu, and alloys thereof) followed by etching away the organic polymeric matrix (scaffold). The resulting metal-based microlattice may then be used as a template to grow the graphitic carbon. The thickness of the electroless plated metal may be controlled in the range of nanometer to micrometer by adjusting the plating time, temperature, and/or plating chemistry.

Figure 1A:
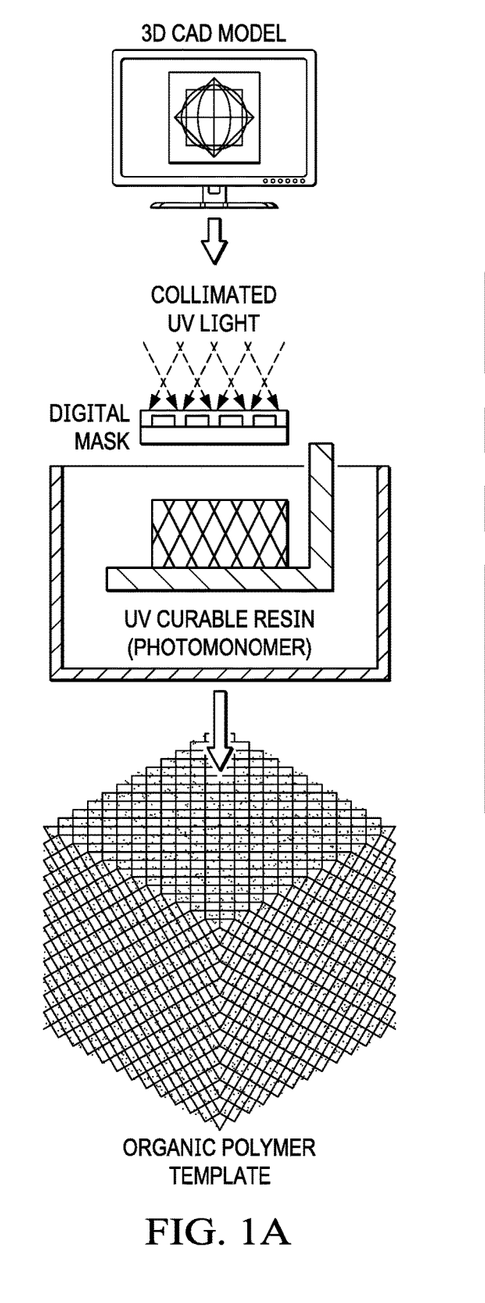
FIG. 1A is a schematic drawing of a fabrication process for an organic polymeric microlattice (scaffold) prior to coating with electroless plating, in accordance with this disclosure.

FIG. 1A schematically illustrates an exemplary fabrication process of an organic polymeric microlattice (scaffold) prior to coating with electroless plating.

The present disclosure employs a "periodically structured" graphene nanostructure. The graphene structures of the prior art are irregular and have much larger dimensions than those which may be achieved using the methodology disclosed herein.

The present process may be used to create a regular array, and the superstructure dimensions (unit cell) and structure may be optimized for strength, thermal and other fundamental properties.

There are several aspects of this procedure that are noteworthy:
  it provides a regular structure with defined dimensions;
  it has the ability to form very thin metal (e.g. Ni, Co, Cu, Ag, Au) microlattices;
  it enables the formation of graphitic carbon on very thin metals by a surface-limited process for very thin metal wires or tubes.

The present process uses a polymeric structure as a template for such fabrication with the subsequent formation of a metal superstructure that may then be exposed to a hydrocarbon (e.g. methane, ethylene, acetylene, benzene) to form graphitic carbon, followed by etching of the metal from under the graphitic carbon using appropriate etchants such as, for example, $FeCl_3$ or potassium permanganate.

Collimated light through a photomask or multi-photon photography may be used in a photo-initiated polymerization to produce a polymer microlattice comprised of a plurality of unit cells. Exemplary polymers include polystyrene and poly(methyl methacrylate) (PMMA). Once polymerized in the desired pattern, the remaining un-polymerized monomer may be removed.

The polymer structure (polymer scaffold) may then be plated with a suitable metal using an electroless plating process.

Electroless nickel plating (EN) is an auto-catalytic chemical technique that may be used to deposit a layer of nickel-phosphorus or nickel-boron alloy on a solid workpiece, such as metal, plastic, or ceramic. The process relies on the presence of a reducing agent, for example hydrated sodium hypophosphite ($NaPO_2H_2.H_2O$) which reacts with the metal ions to deposit metal. Alloys with different percentages of phosphorus, ranging from 2-5 (low phosphorus) to up to 11-14 (high phosphorus) are possible. The metallurgical properties of the alloys depend on the percentage of phosphorus.

Electroless plating has several advantages over electroplating. Free from flux-density and power supply issues, it provides an even deposit regardless of workpiece geometry, and with the proper pre-plate catalyst, may deposit on non-conductive surfaces. In contradistinction, electroplating can only be performed on electrically conductive substrates.

Before performing electroless plating, the material to be plated must be cleaned by a series of chemicals; this is known as the pre-treatment process. Failure to remove unwanted "soils" from the part's surface results in poor plating. Each pre-treatment chemical must be followed by water rinsing (normally two to three times) to remove chemicals that may adhere to the surface. De-greasing removes oils from surfaces, whereas acid cleaning removes scaling.

Activation may be done with an immersion into a sensitizer/activator solution—for example, a mixture of palladium chloride, tin chloride, and hydrochloric acid. In the case of non-metallic substrates, a proprietary solution is often used.

The pre-treatment required for the deposition of metals on a non-conductive surface usually consists of an initial surface preparation to render the substrate hydrophilic. Following this initial step, the surface may be activated by a solution of a noble metal, e.g., palladium chloride. Electroless bath formation varies with the activator. The substrate is then ready for electroless deposition.

The reaction is accomplished when hydrogen is released by a reducing agent, normally sodium hypophosphite (with the hydrogen leaving as a hydride ion) or thiourea, and oxidized, thus producing a negative charge on the surface of the part. The most common electroless plating method is electroless nickel plating, although silver, gold and copper layers can also be applied in this manner.

In principle any hydrogen-based reducing agent can be used although the redox potential of the reducing half-cell must be high enough to overcome the energy barriers inherent in liquid chemistry. Electroless nickel plating most often employs hypophosphite as the reducer while plating of other metals like silver, gold and copper typically makes use of low-molecular-weight aldehydes.

A benefit of this approach is that the technique can be used to plate diverse shapes and types of surfaces.

Figure 1B:
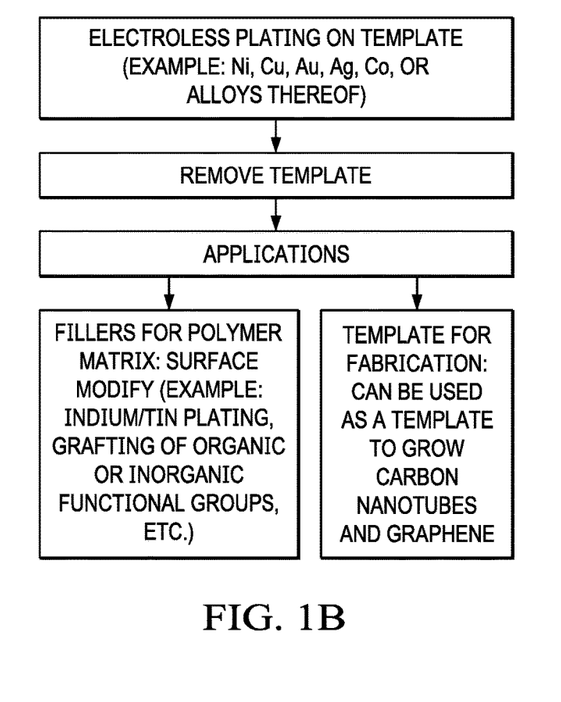
FIG. 1B is a flowchart of a fabrication process for a lattice which may follow the fabrication process of FIG. 1A, in accordance with this disclosure.

As illustrated in FIG. 1B, the organic polymeric microlattice may be electrolessly plated with metal (e.g., comprising copper or nickel) followed by dissolving out the organic polymer scaffold. The fabricated metal-based microlattice is used as a template to synthesize a graphitic carbon superstructure. The metal may then be etched out to produce a graphene microstructure comprising a plurality of interconnected unit cells wherein each unit cell is formed of interconnected graphene tubes.

As an alternative to or in addition to the above processes, the graphene lattices may be formed via any of the fabrication techniques (or portion(s) of the fabrication techniques thereof, including any pre-treatments) described in U.S. Provisional Application Ser. No. 62/611,347, filed Dec. 28, 2017, entitled "SP$^2$-Bonded Carbon Structures", all of which are hereby incorporated in this disclosure.

Figure 2:
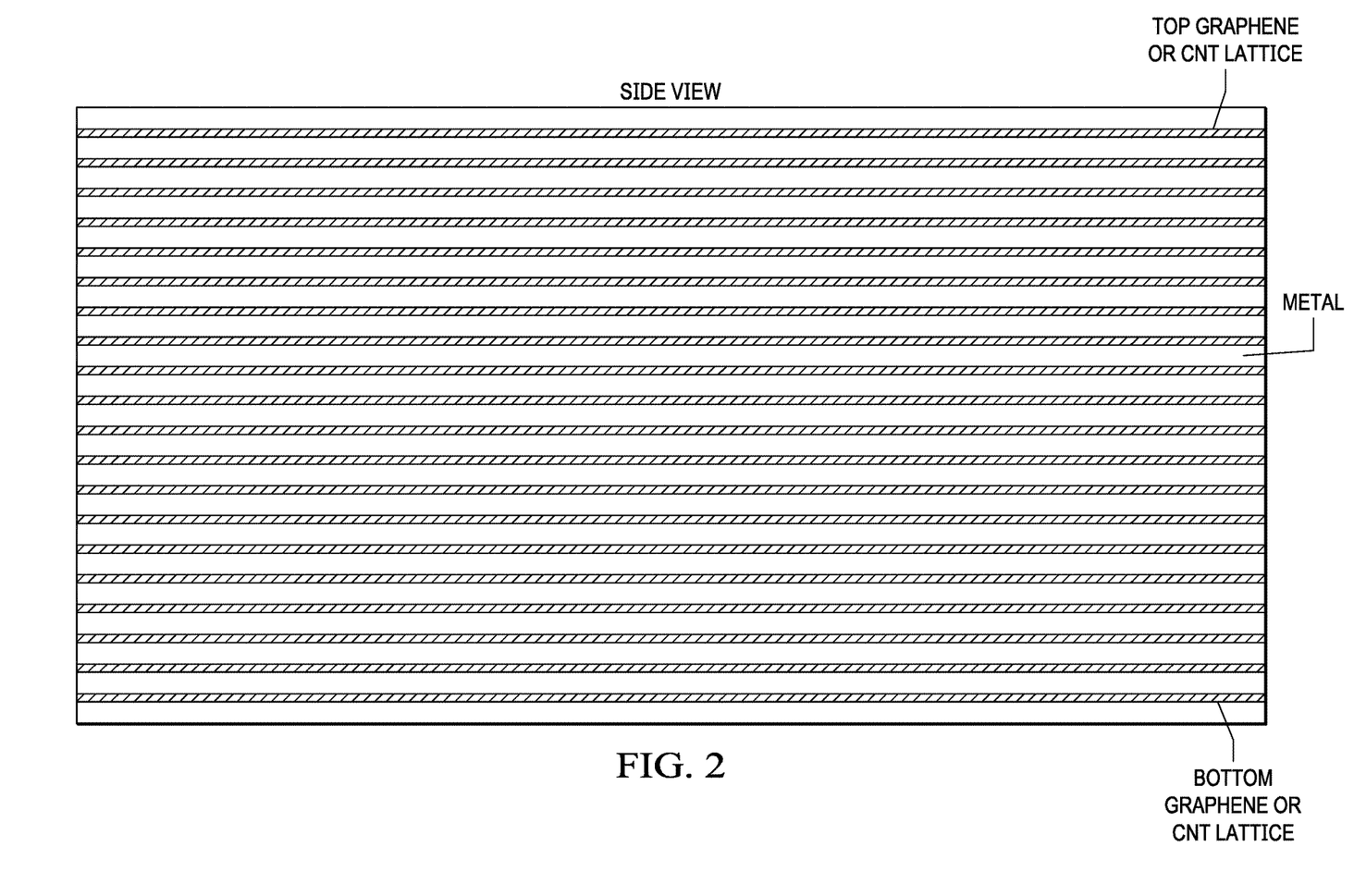
FIG. 2 is a side view of a metal-graphene (or carbon nanotube (CNT)) lattice structure, in accordance with this disclosure.

With reference to FIG. 2, growth or electrodeposition (e.g., electroplating) of a metal such as Cu is performed. Then the metal electrodeposition is interrupted followed by deposition (e.g., via manually transference) of functionalized graphene lattice on the electrodeposited metal. Functionalization of the graphene lattice is performed in order to create sufficient attraction (i.e., a good interface) to the metal during the subsequent deposition of the functionalized graphene lattice on the metal layer. The type of functionalization depends on the composition of the metal layer. For example, if Cu, Ag, or Au is used as the metal in the metal layer, a functional group comprising sulfur would be employed (via, for example, grafting a sulfur containing compound to the graphene lattice) to functionalize the graphene lattice due to attraction of Cu, Ag, or Au (the metal layer) to sulfur.

The graphene lattice deposition causes the graphene lattice to be deposited on (and eventually partially or entirely inserted or embedded within) the underlying metal layer such that the metal spreads or grows through holes within the graphene lattice. The forming of the metal layer and the forming of the lattice are sequentially and successively repeated until the metal-graphene lattice composite structure reaches a desired thickness. FIG. 2 shows, for example, twenty rows of graphene lattices or lattice sheets, with each graphene lattice depicted via a horizontal dashed line. The height of each graphene lattice sheet, in any of the examples, may be, for example, 5-400 micron in height, 5-400 micron in width, and 5-400 micron in depth. The shape of each graphene lattice may be rectangular, hexagonal, diamond, face centered cubic lattice (FCC), body centered cubic lattice (BCC), or another shape.

The metal-graphene lattice composite structure may be employed, inter alia, as a bump (or portion thereof) for an integrated circuit package.

Figure 3:
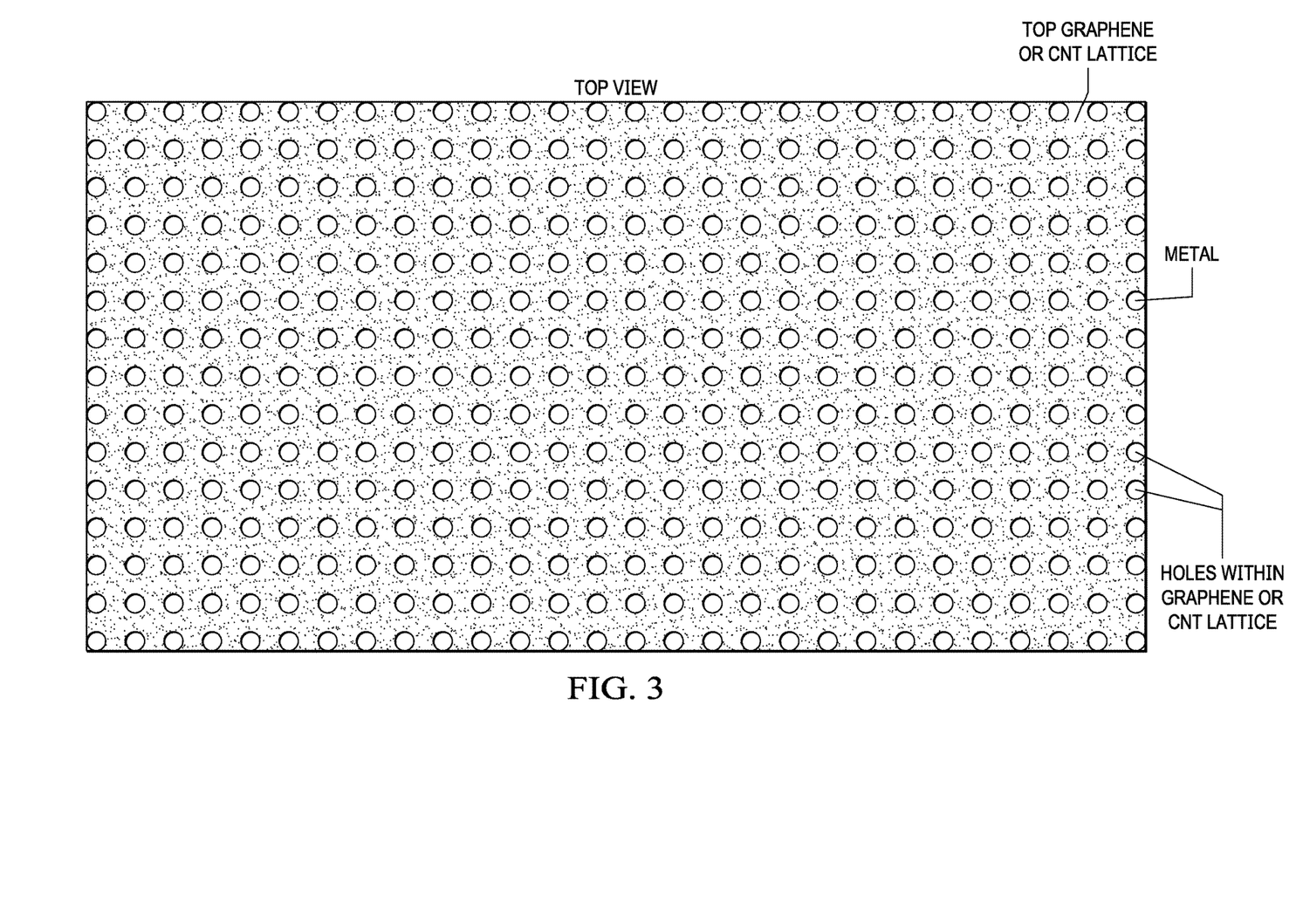
FIG. 3 is a top view of a metal-graphene (or CNT) lattice structure, in accordance with this disclosure.

With additional reference to FIG. 2 (side view) and FIG. 3 (top view), in one aspect of the disclosure, a structure includes a metal layer and a plurality of interconnected unit cells including at least a first unit cell formed of first interconnected segments, and a second unit cell formed of second interconnected segments. The plurality of interconnected unit cells forms a lattice. The lattice is contained at least partly within the metal layer.

In an example, the metal layer and the lattice are at least a portion of a semiconductor device.

In an example, the lattice comprises graphene or carbon nanotubes.

In an example, the metal layer comprises at least one element selected from the group consisting of W, Cu, Al, Ni, Pd, Au, Ag, Co, and combinations thereof.

In an example, the lattice is contained entirely within the metal layer.

In an example, the first and second interconnected segments are hollow tubes.

In an example, the first and second interconnected segments are tubes filled with a non-conducting material.

Also, with reference to FIG. 2 (side view) and FIG. 3 (top view), in another aspect of the disclosure, a bump structure for an integrated circuit package includes a metal layer and a plurality of interconnected unit cells including at least a first unit cell formed of first interconnected segments, and a second unit cell formed of second interconnected segments. The plurality of interconnected unit cells forms a lattice. The lattice is contained at least partly within the metal layer.

In an example, the lattice comprises graphene or carbon nanotubes.

In an example, the metal layer comprises at least one element selected from the group consisting of W, Cu, Al, Ni, Pd, Au, Ag, Co, and combinations thereof.

In an example, the lattice is contained entirely within the metal layer.

In an example, the first and second interconnected segments are hollow tubes.

In an example, the first and second interconnected segments are tubes filled with a non-conducting material.

Figure 8:
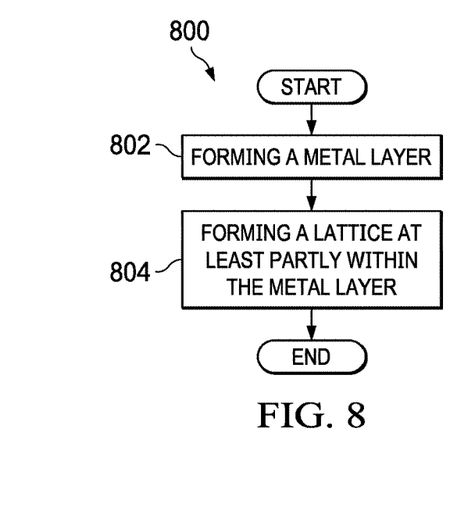
FIG. 8 is a flowchart illustrating a method of forming a bump structure for an integrated circuit package, in accordance with this disclosure.

With reference to FIG. 8, in yet another aspect of the disclosure, a method 800 of forming a bump structure for an integrated circuit package includes forming a metal layer (block 802) and forming a lattice at least partly within the metal layer (block 804), including by photo-initiating polymerization of a monomer in a pattern of interconnected unit cells to form a polymer lattice (wherein the interconnected unit cells include at least a first unit cell formed of first interconnected segments, and a second unit cell formed of second interconnected segments), removing the unpolymerized monomer, coating the polymer lattice with a metal, removing the polymer lattice to leave a metal lattice, depositing graphitic carbon on the metal lattice, converting the graphitic carbon to graphene or carbon nanotubes, and removing the metal lattice.

In an example of the method, the lattice comprises carbon nanotubes.

In an example of the method, the metal layer comprises at least one element selected from the group consisting of W, Cu, Al, Ni, Pd, Au, Ag, Co, and combinations thereof.

In an example of the method, the lattice is contained entirely within the metal layer.

In an example of the method, the first and second interconnected segments are hollow tubes.

In an example of the method, the first and second interconnected segments are tubes filled with a non-conducting material.

In an example of the method, the forming of the metal layer and the forming of the lattice are sequentially and successively repeated.

Figure 4:
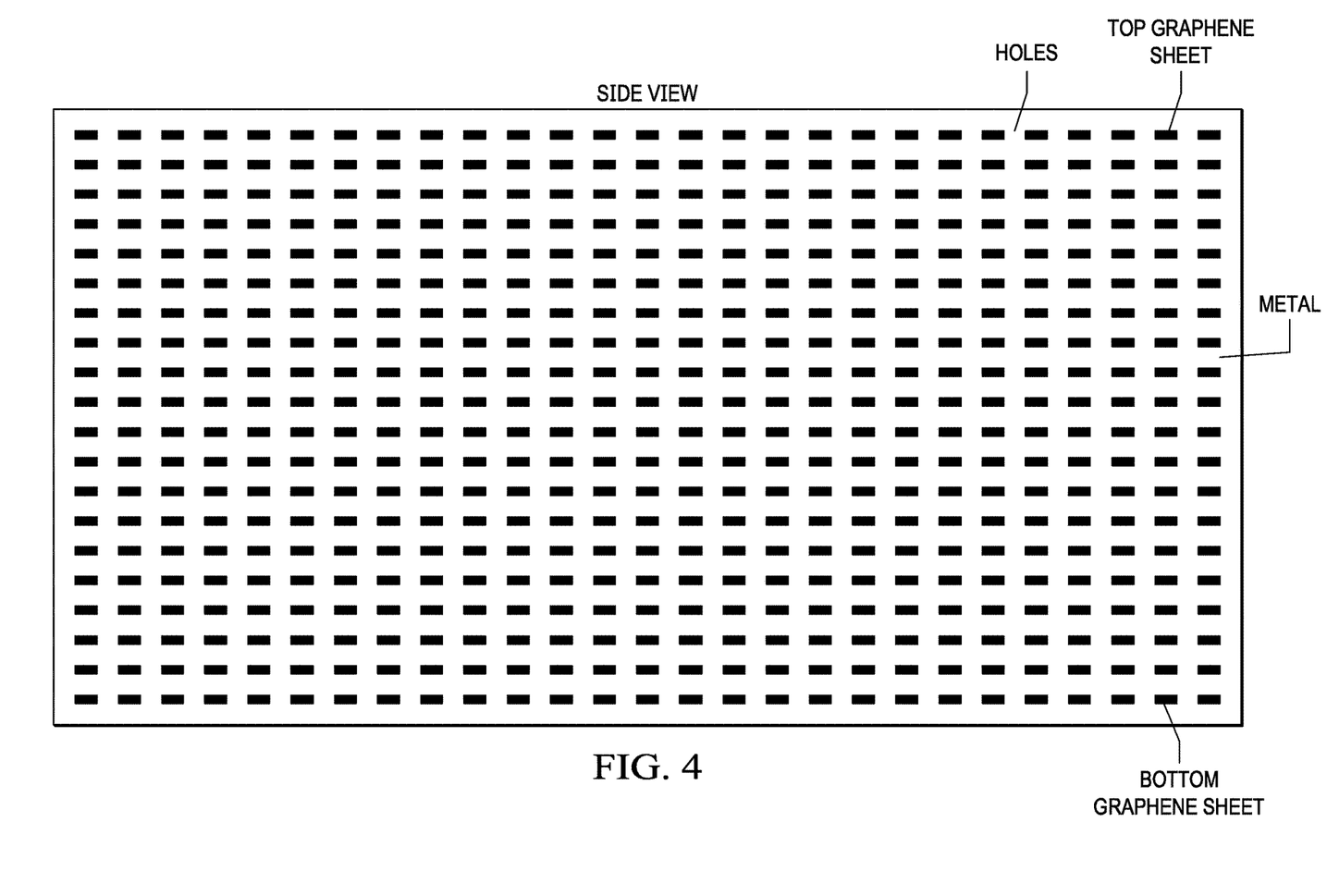
FIG. 4 is a side view of a metal-holey graphene sheet structure, in accordance with this disclosure.
Figure 5:
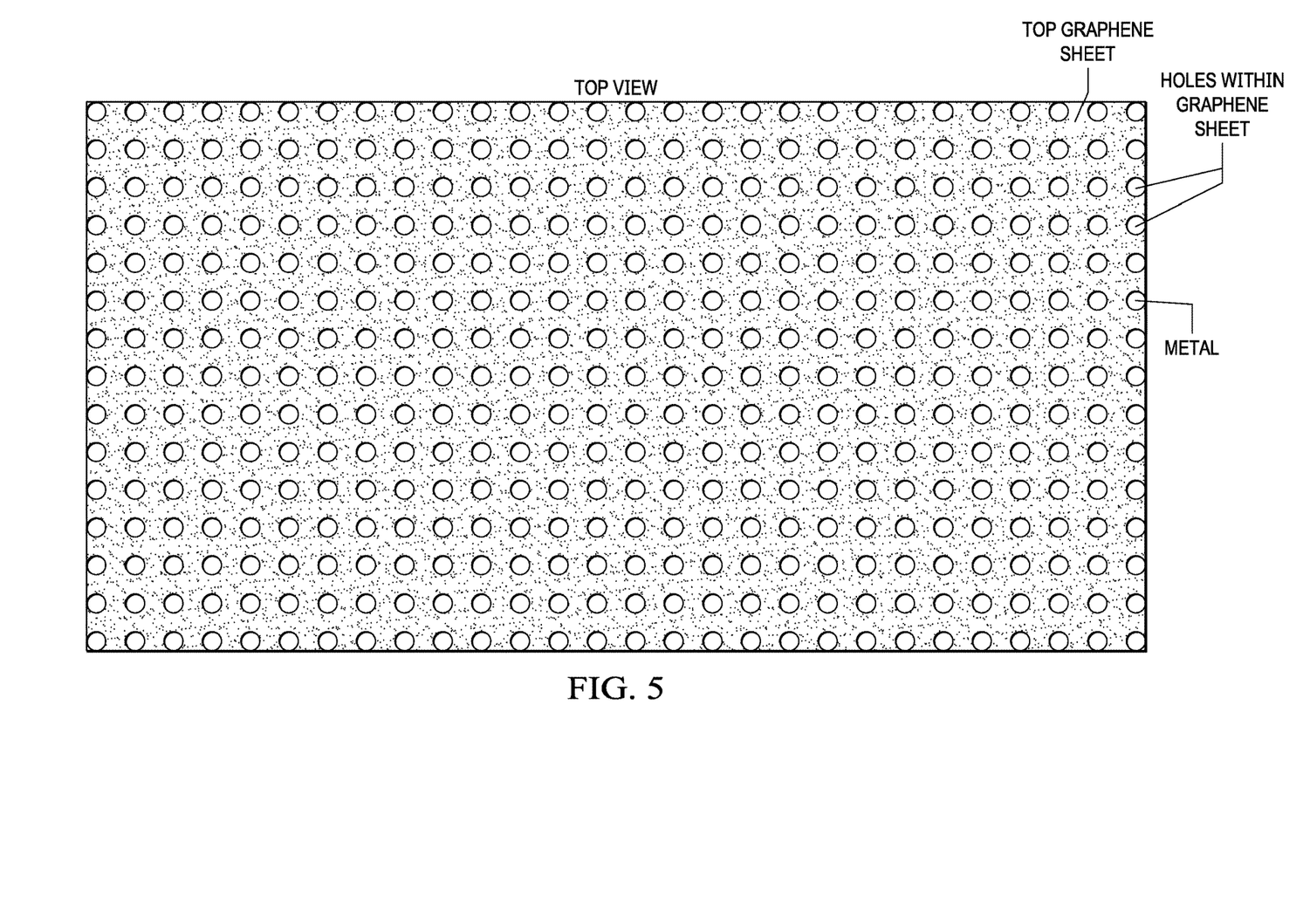
FIG. 5 is a top view of a metal-holey graphene sheet structure, in accordance with this disclosure.

With reference to FIG. 4 (side view) and FIG. 5 (top view), in another aspect of the disclosure, a structure includes a metal layer and a graphene sheet having at least one hole. The graphene sheet is contained at least partly within the metal layer.

In an example, the metal layer and the graphene sheet are at least a portion of a semiconductor device.

In an example, the metal layer comprises at least one element selected from the group consisting of W, Cu, Al, Ni, Pd, Au, Ag, Co, and combinations thereof.

In an example, the graphene sheet is contained entirely within the metal layer.

In an example, the graphene sheet has a plurality of holes.

In an example, the structure further comprises another graphene sheets having at least one hole, wherein the graphene sheets are contained at least partly within the metal layer.

In an example, the graphene sheets are contained entirely within the metal layer.

Figure 9:
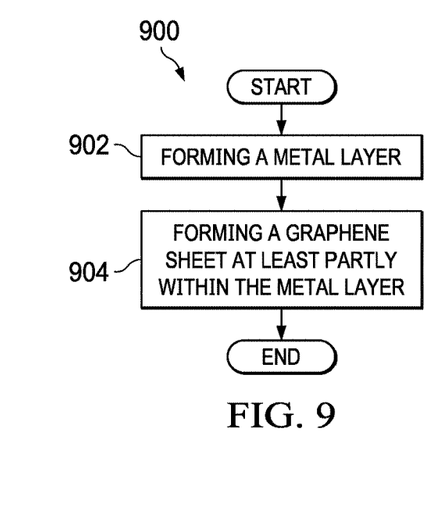
FIG. 9 is a flowchart illustrating a method of forming a bump structure for an integrated circuit package, in accordance with this disclosure.

With reference to FIG. 9, in yet another aspect of the disclosure, a method 900 of forming a structure includes forming a metal layer (block 902) and forming a graphene sheet at least partly within the metal layer (block 904). The graphene sheet has at least one hole.

In an example of the method, the graphene sheet is formed by using the metal layer for the catalysis of graphene growth by chemical vapor deposition (CVD) using a carbon-containing gas, and stopping the graphene growth before nucleated islands of graphene fully grow to cover a surface of the metal layer thereby leaving the at least one hole in the graphene sheet. A portion of the metal layer is exposed through the at least one hole.

In an example of the method, the graphene sheet is formed by using the metal layer for the catalysis of graphene growth by chemical vapor deposition (CVD) using a carbon-containing gas, growing a graphene film without holes over a surface of the metal layer, forming a patterned photoresist on the graphene film, removing at least one exposed area of the graphene film via etching (e.g., using an oxygen or plasma etch), and removing the photoresist (e.g., via stripping) thereby leaving the graphene sheet having at least one hole. A portion of the metal layer is exposed through the at least one hole.

In an example of the method, the method further includes depositing another metal layer on the graphene sheet, wherein the another metal layer forms a metal diffusion bond with a portion of the formed metal layer through the at least one hole in the graphene sheet, forming another graphene sheet over a surface of the another metal layer (wherein the another graphene sheet has at least one hole—the forming of the another graphene sheet may be accomplished, for example, via either growth process described above), and depositing a further metal layer on the another graphene sheet. The further metal layer forms a metal diffusion bond with a portion of the another metal layer through the at least one hole in the another graphene sheet.

In an example of the method, the above processes may be further repeated until the structure achieves a desired thickness.

Hole(s) in graphene sheets are important and advantageous over having no holes for at least the following reasons:

1. Metal has poor adhesion to carbon/graphene. If graphene sheets were employed without holes similar to a layer cake (i.e., with interleaving metal layers), the metal layers and graphene sheets would delaminate. Connecting a metal layer through the graphene sheet (via holes) to the next layer of metal allows for mechanical stability of the entire composite structure with little or no delamination; and
2. Graphene has great horizontal/lateral thermal conductivity (across the plane of the film), but poor vertical thermal conductivity (perpendicular to the plane of the film).

The holes allow thermal energy to travel in the vertical direction and then rapidly spread horizontally/laterally throughout the graphene sheet.

Figure 6:
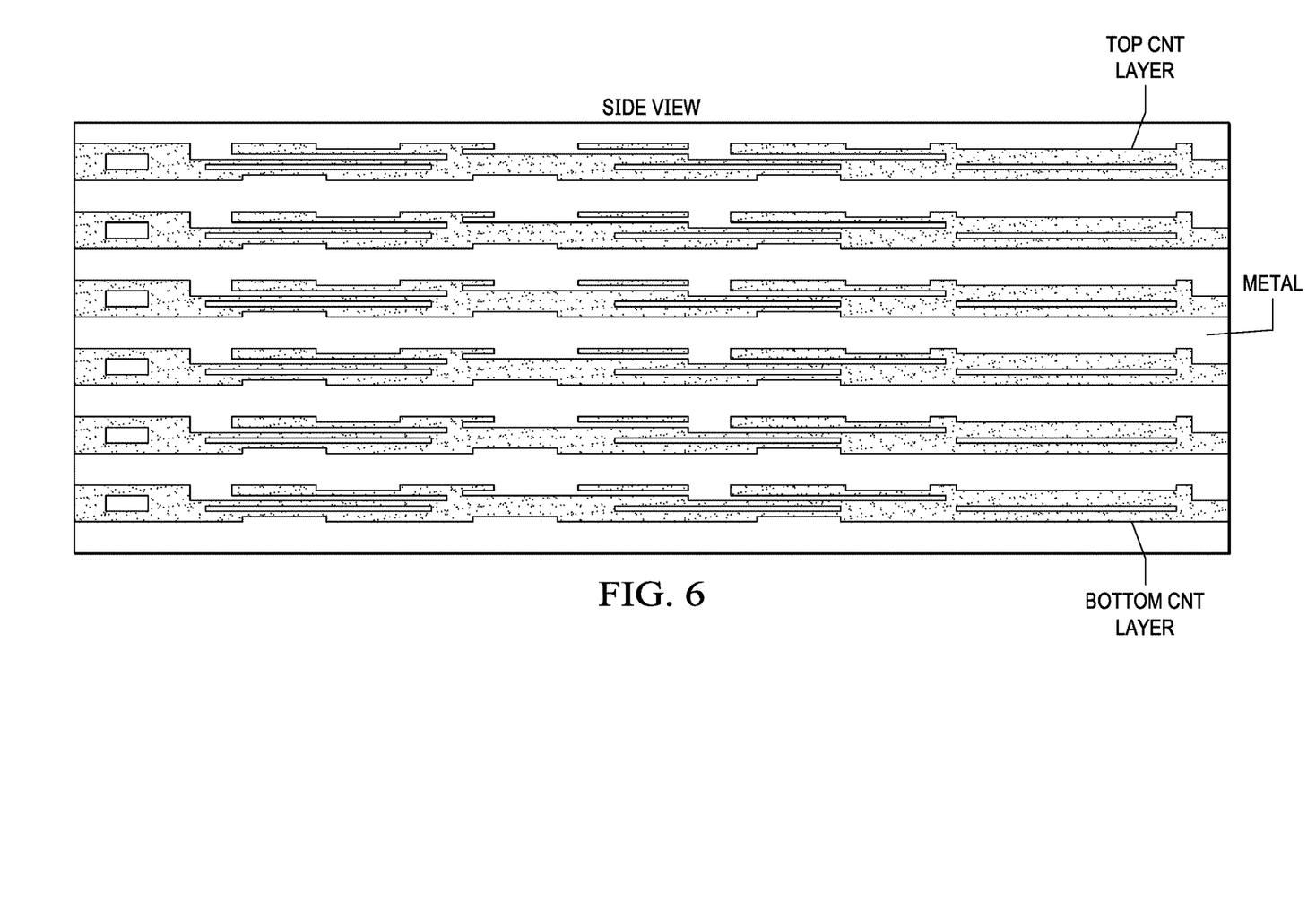
FIG. 6 is a side view of a metal-CNT layer structure, in accordance with this disclosure.
Figure 7:
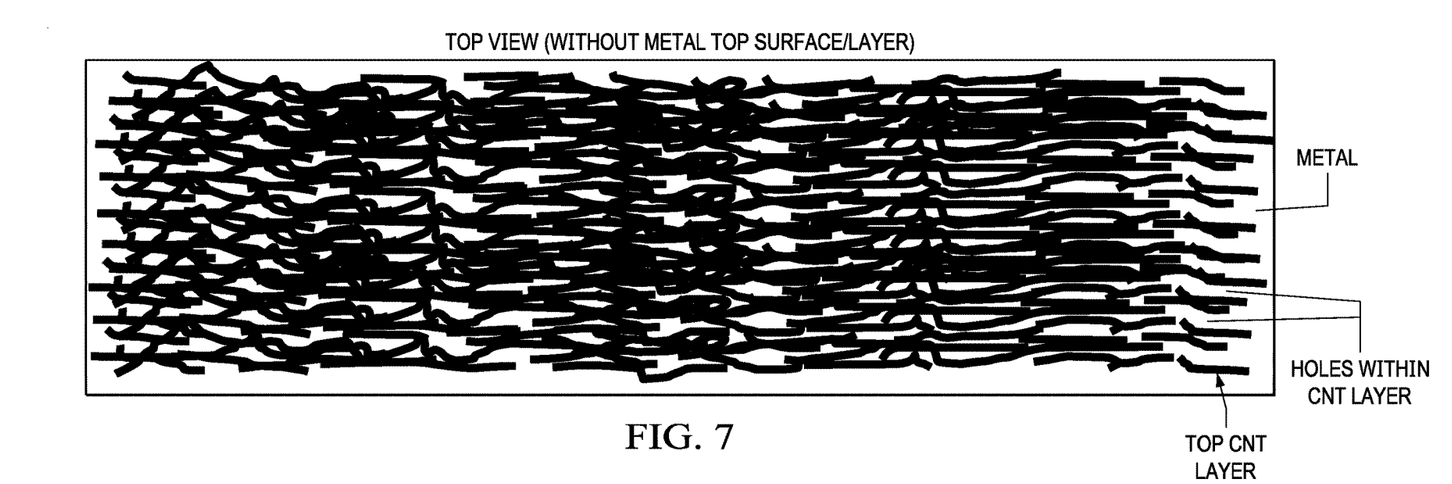
FIG. 7 is a top view of a metal-CNT layer structure, in accordance with this disclosure.

With reference to FIG. 6 (side view) and FIG. 7 (top view), in another aspect of the disclosure, a structure includes a metal layer and a layer of carbon nanotubes having at least one hole between at least two of the carbon nanotubes. The sheet is contained at least partly within the metal layer. The carbon nanotubes within the sheet may or may not fall within a single plane.

Figure 10:
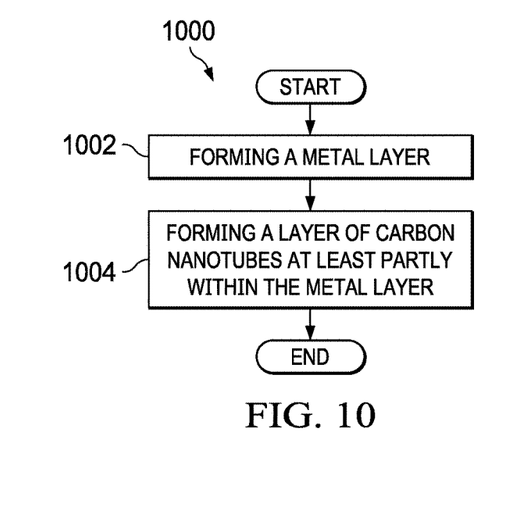
FIG. 10 is a flowchart illustrating a method of forming a bump structure for an integrated circuit package, in accordance with this disclosure.

With reference to FIG. 10, in yet another aspect of the disclosure, a method 1000 of forming a structure includes forming a metal layer (block 1002) and forming a layer of carbon nanotubes at least partly within the metal layer (block 1004). The layer of carbon nanotubes has at least one hole between at least two of the carbon nanotubes.

In an example of the method, the layer of carbon nanotubes is formed by spin coating or growing a layer of carbon nanotubes having a porosity sufficient to leave the at least one hole in the layer of carbon nanotubes. A portion of the metal layer is exposed through the at least one hole.

In an example of the method, the method further includes depositing another metal layer (via. for example, sputtering, electrodeposition, or electroless deposition) on the layer of carbon nanotubes (wherein the another metal layer forms a metal diffusion bond with a portion of the formed metal layer through the at least one hole in the layer of carbon nanotubes), forming another layer of carbon nanotubes over a surface of the another metal layer (wherein the another layer of carbon nanotubes has at least one hole—the forming of the another layer of carbon nanotubes may be accomplished, for example, via the spin coating or growth process described above), and depositing a further metal layer on the another layer of carbon nanotubes. The further metal layer forms a metal diffusion bond with a portion of the another metal layer through the at least one hole in the another layer of carbon nanotubes.

In an example of the method, the above processes may be further repeated until the structure achieves a desired thickness.

The advantages of employing a layer of carbon nanotubes having at least one hole between at least two of the carbon nanotubes are at least the same or similar to those advantages described above for the graphene sheet with hole(s).

The use of metal reinforced with holey graphene sheets, CNT layers, 3D graphene lattices, or 3D CNT lattices, as described above, achieves optimum strength, structural stability, electrical conductivity, and thermal conductivity. These desired properties are not achievable via employing metals or SP2 bonded carbon individually.

In any of the examples above, the graphene employed as the lattice (i.e., graphene lattice) could alternatively be replaced with CNTs (i.e., CNT lattice). The above-mentioned processes of manufacturing the graphene lattice (or portions thereof) may be adjusted accordingly for a CNT lattice. Steps in the above-mentioned processes may also be eliminated or added dependent on the material and/or type of lattice employed. Such alternatives are considered to be within the spirit and scope of the disclosure, and may therefore utilize the advantages of the configurations and examples described above.

In any of the examples above, the metal employed could alternatively be replaced with a metal alloy. Such alternatives are considered to be within the spirit and scope of the disclosure, and may therefore utilize the advantages of the configurations and examples described above.

The method steps in any of the examples described herein are not restricted to being performed in any particular order. Also, structures mentioned in any of the method examples may utilize structures mentioned in any of the device examples. Such structures may be described in detail with respect to the device examples only but are applicable to any of the method examples.

Features in any of the examples described in this disclosure may be employed in combination with features in other examples described herein, and such combinations are considered to be within the spirit and scope of the present disclosure.

Modifications are possible in the described embodiments, and other embodiments are possible, within the scope of the claims.

What is claimed is:

1. A structure comprising:
   a metal layer; and
   interconnected unit cells forming a lattice contained at least partly within the metal layer, including a unit cell formed of interconnected graphene tubes;
   wherein the metal layer protrudes through holes within the lattice.

2. The structure of claim 1, wherein the metal layer and the lattice are at least a portion of a semiconductor device.

3. The structure of claim 1, wherein the lattice includes graphene or carbon nanotubes.

4. The structure of claim 1, wherein the metal layer comprises at least one element selected from the group consisting of W, Cu, Al, Ni, Pd, Au, Ag, Co, and combinations thereof.

5. The structure of claim 1, wherein the lattice is contained entirely within the metal layer.

6. The structure of claim 1, wherein the interconnected graphene tubes are hollow tubes.

7. The structure of claim 1, wherein the interconnected graphene tubes are filled with a non-conducting material.

8. A bump structure for an integrated circuit package, the bump structure comprising:
   a metal layer; and
   interconnected unit cells forming a lattice contained at least partly within the metal layer, including a unit cell formed of interconnected graphene tubes;
   wherein the metal layer protrudes through holes within the lattice.

9. The bump structure of claim 8, wherein the lattice comprises graphene or carbon nanotubes.

10. The bump structure of claim 8, wherein the metal layer comprises at least one element selected from the group consisting of W, Cu, Al, Ni, Pd, Au, Ag, Co, and combinations thereof.

11. The bump structure of claim 8, wherein the lattice is contained entirely within the metal layer.

12. The bump structure of claim 8, wherein the interconnected graphene tubes are hollow tubes.

13. The bump structure of claim 8, wherein the interconnected graphene tubes are filled with a non-conducting material.

* * * * *